US006424017B2

(12) United States Patent
Kurtz et al.

(10) Patent No.: US 6,424,017 B2
(45) Date of Patent: Jul. 23, 2002

(54) SILICON-ON-SAPPHIRE TRANSDUCER

(75) Inventors: Anthony D. Kurtz, Teaneck; Alexander A. Ned, Bloomingdale, both of NJ (US)

(73) Assignee: Kulite Semiconductor Products, Inc.

( * ) Notice: Subject to any disclaimer, the term of this patent is extended or adjusted under 35 U.S.C. 154(b) by 0 days.

(21) Appl. No.: 09/854,949

(22) Filed: May 14, 2001

Related U.S. Application Data

(62) Division of application No. 09/229,250, filed on Jan. 12, 1999, now Pat. No. 6,235,611.

(51) Int. Cl.[7] .............................................. H01L 29/82
(52) U.S. Cl. ........................ 257/419; 257/347; 257/507
(58) Field of Search ..................... 438/736, 10, 16–18, 438/141, 142, 404, 455, 456, 479, 517, 532, 659, 967; 257/414, 140, 419, 507, 508, 587, 347

(56) References Cited

U.S. PATENT DOCUMENTS 4,672,354 A * 6/1987 Kurtz et al. ................... 338/4
4,814,845 A * 3/1989 Kurtz et al. ................... 73/724
4,814,856 A * 3/1989 Kurtz et al. ................... 338/4
5,877,094 A * 3/1999 Egley et al. ................ 438/763

* cited by examiner

Primary Examiner—Michael J. Sherry
Assistant Examiner—Asok Kumar Sarkar
(74) Attorney, Agent, or Firm—Duane Morris LLP; Arthur L. Plevy

(57) ABSTRACT

A method for making silicon-on-sapphire transducers including the steps of forming a first silicon layer on a first side of a first sapphire wafer; bonding a second sapphire wafer to the first side of the first sapphire wafer such that the first silicon layer is interposed between the first and second sapphire wafers; reducing the thickness of the first sapphire wafer to a predetermined thickness; depositing a second silicon layer on a second surface of the first sapphire wafer, wherein the second surface of the first sapphire wafer is oppositely disposed from the first surface of the first sapphire wafer; bonding a silicon wafer to the second surface of the first sapphire wafer such that the second silicon layer is interposed between the first sapphire wafer and the silicon wafer, wherein the silicon wafer includes p+ regions indicative of a transducer structure and non-p+ regions; and, removing the non-p+ regions of the silicon wafer thus forming the transducer structure of p+ regions on the second surface of the first sapphire wafer.

4 Claims, 5 Drawing Sheets

SILICON-ON-SAPPHIRE TRANSDUCER

RELATED APPLICATIONS

This application is a division application of commonly assigned, application Ser. No. 09/229,250, entitled, "METHOD OF MAKING SILICON-ON-SAPPHIRE TRANSDUCERS", filed Jan. 12, 1999, now U.S. Pat. No. 6,235,611.

FIELD OF INVENTION

The present invention relates to silicon-on-sapphire transducers, and more particularly to an improved method for making the same.

BACKGROUND OF THE INVENTION

As is known, as a deflecting diaphragm, single-crystal sapphire has certain unique advantages. Not only is it a single crystal that displays no mechanical hysteresis when deflected, exhibiting only elastic deformation, but is ultra-resistant to almost any chemical attack or etching. While this may be an advantage in a finished transducer, it causes significant difficulties in fabrication.

Sapphire has a modulus of about $70 \times 10^6$ PSI as compared to that of silicon which, in the transverse direction in the surface plane <100> (as defined on FIG. 4A), is about $20 \times 10^6$ PSI. As a result, for the same electrical output from a piezoresistive Wheatstone bridge silicon grown or otherwise fastened to sapphire, the flexing diaphragm must be thinner by the ratio of $$\sqrt{\frac{Y_{aL_2O_3}}{Y_{si}}} \quad (1)$$

This means that to fabricate a pressure transducer of sapphire with the same surface stress as one of silicon, since the surface stress is proportional to $$\frac{1}{Y} \frac{a^2}{t^2} \quad (2)$$

where a is the radius of the deflecting portion and t is the thickness, a diaphragm of sapphire must have a much larger diameter than one of silicon, or be much thinner.

However, because of the inert nature of sapphire, it is almost impossible to thin the sapphire diaphragm by conventional means. Further, making a diaphragm of sufficient size to get enough stress lowers the number of sensors that can be made from an individual slice as well as lowering the resultant natural frequency of the finished sensors. Additionally, slices of commercially available sapphire are usually thick (about 0.020"). However, for a relatively small diameter sensor, a thickness on the order of 0.005 inches is required.

The present invention is designed to overcome these constraints and to produce a relatively smaller silicon on sapphire sensor with enhanced characteristics.

SUMMARY OF INVENTION

An improved method for making silicon-on-sapphire transducers including the steps of: sputtering or otherwise growing a silicon layer on a first surface of a commercially available first sapphire wafer.

Affixing a second sapphire wafer including a series of apertures to the first surface the first sapphire wafer, preferably by means of E.S. bonding, fusion bonding or any other suitable means as is understood by those possessing ordinary skill in the pertinent art.

Lapping and polishing a second surface of the first sapphire wafer until the first sapphire wafer is reduced to a desired thickness. The second sapphire wafer, which was previously secured to the first wafer, serves to strengthen the first wafer during this process.

Growing and/or sputtering a silicon layer on the now polished surface of the first sapphire wafer. This silicon layer is then oxidized using any well known, conventional technique.

A third wafer containing a series of sensor networks is formed using any suitable process. The third wafer includes p+ areas which include a sensor network and a group of contact areas extending from the sensor network. Outside of the contact areas, another p+ area separate from the contact areas but surrounding them, is also formed. The third wafer is then preferably fusion-bonded to the oxidized surface of the first sapphire wafer, and the non p+ areas are removed preferably by using a conductivity selective etch.

Appropriate areas in the p+ contact regions are preferably metalized using a high temperature metal system such as platinum silicide, titanium, or platinum.

A fourth wafer made of glass or any suitable, non-conductive material, is prepared such that there are a series of apertures corresponding to the various metalized contact areas on the first wafer. Additionally, there is preferably provided a slight depression in the fourth wafer corresponding to the area of the sensor network to allow the diaphragm to deflect without touching the glass.

Finally, the glass wafer is preferably sealed using an ES Bond to the p+ contact areas, and the apertures over the metalized areas may be filled with a glass metal frit to make electrical contacts to metalized areas of the p+ regions. If the seal of the glass wafer to the p+ contact area is not through a central aperture in the glass wafer over the deflecting portion of the first sapphire wafer, an absolute sensor will result. If there is a through-central aperture, a gage or differential sensor will result.

DETAILED DESCRIPTION OF THE INVENTION

Figure 1:
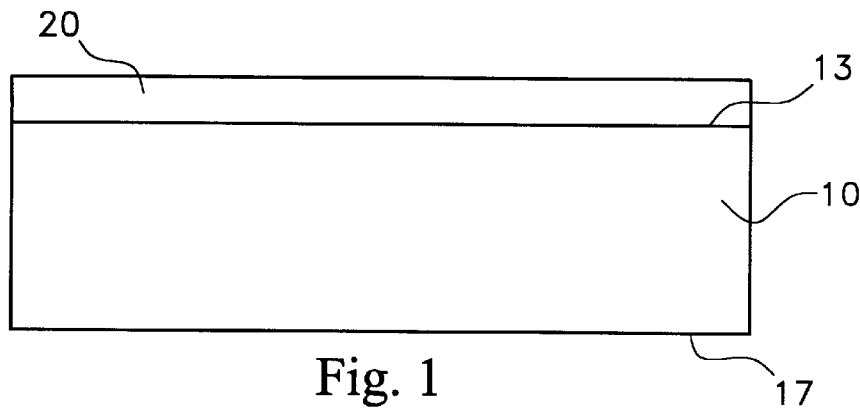
FIG. 1 illustrates a cross section of a silicon and sapphire structure according to the present invention.

Referring now to the many figures, wherein like references refer to like elements of the invention, FIG. 1 illustrates a commercially available slice of sapphire 10 having a thin silicon layer 20 grown on one surface 13, for example by sputtering.

Figure 2:
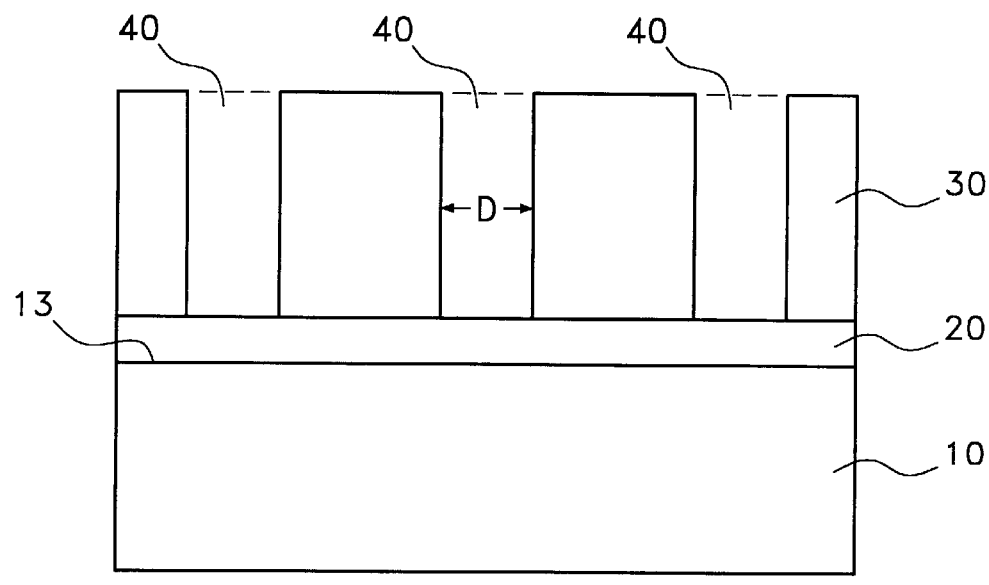
FIG. 2 illustrates a cross section of a structure according to FIG. 1 having an additional sapphire wafer bonded according to the present invention.

FIG. 2 illustrates a second sapphire wafer 30 including a series of apertures 40 each having a diameter D which is preferably about 0.150 inches in diameter, affixed to surface 13 of the first wafer by means of E.S. bonding, fusion bonding or any other suitable means as is understood by those possessing ordinary skill in the pertinent art. An example of E.S. bonding can be seen in commonly assigned U.S. Pat. No. 3,951,707, entitled Method for Fabricating Glass-backed Transducers and Glass-backed Structures, the disclosure of which is incorporated by reference herein, while a suitable example of fusion bonding is illustrated in commonly assigned U.S. Pat. No. 5,286,671, entitled Fusion Bonding Technique for Use in Fabricating Semiconductor Devices, the disclosure of which is also incorporated by reference herein.

The apertures 40 can be formed prior to bonding sapphire wafer 30 to sapphire wafer 10 using any suitable means known to those skilled in the art.

Figure 3:
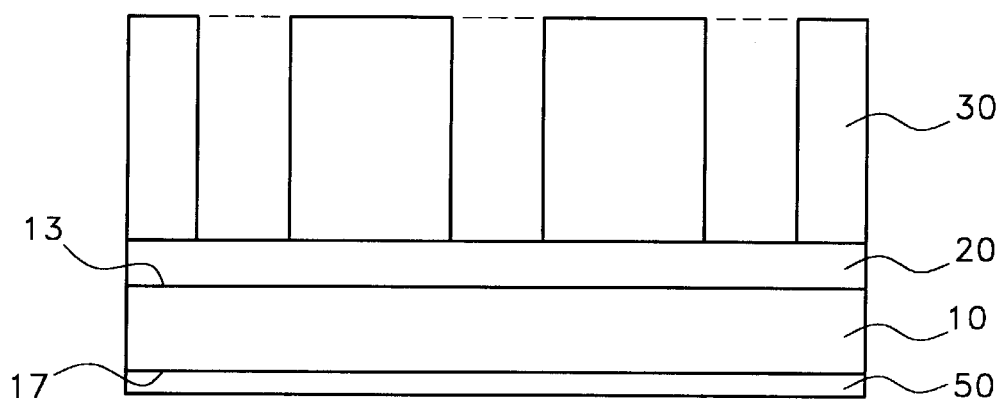
FIG. 3 illustrates a cross section of a structure according to FIG. 2 after thinning according to the present invention.

Referring now to FIG. 3, therein is illustrated a next step according to the present invention, wherein the surface 17 (opposing surface 13) of the sapphire wafer 10 is then lapped and polished until the first sapphire wafer 10 is reduced to a desired thickness, preferably approximately 0.005 inches. The second wafer 30, which was previously secured to the first wafer 10, serves to strengthen the first wafer 10 during this process.

Next, a silicon layer 50 is grown, for example sputtered, on the now polished surface 17 of the first wafer 10. This silicon layer 50 is then preferably oxidized using any well known, conventional technique.

Figure 4A:
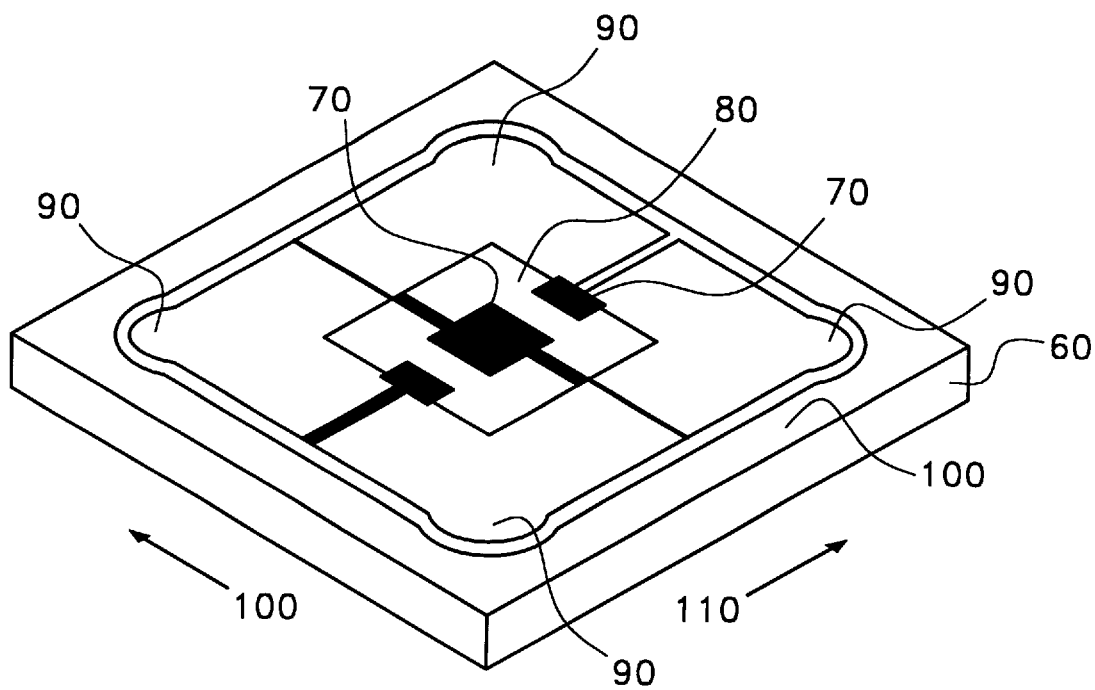
FIG. 4A illustrates an isometric view of a silicon wafer utilized according to the present invention.
Figure 4B:
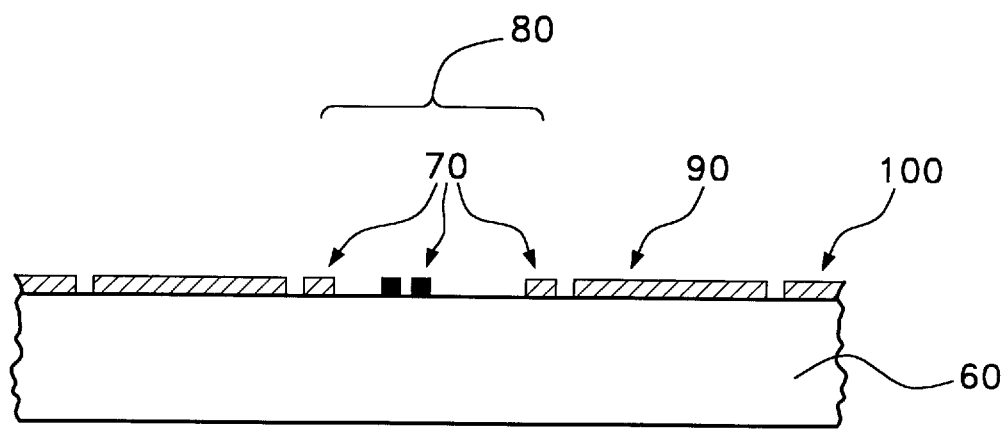
FIG. 4B illustrates a cross section of the silicon wafer of FIG. 4A.
Figure 5:
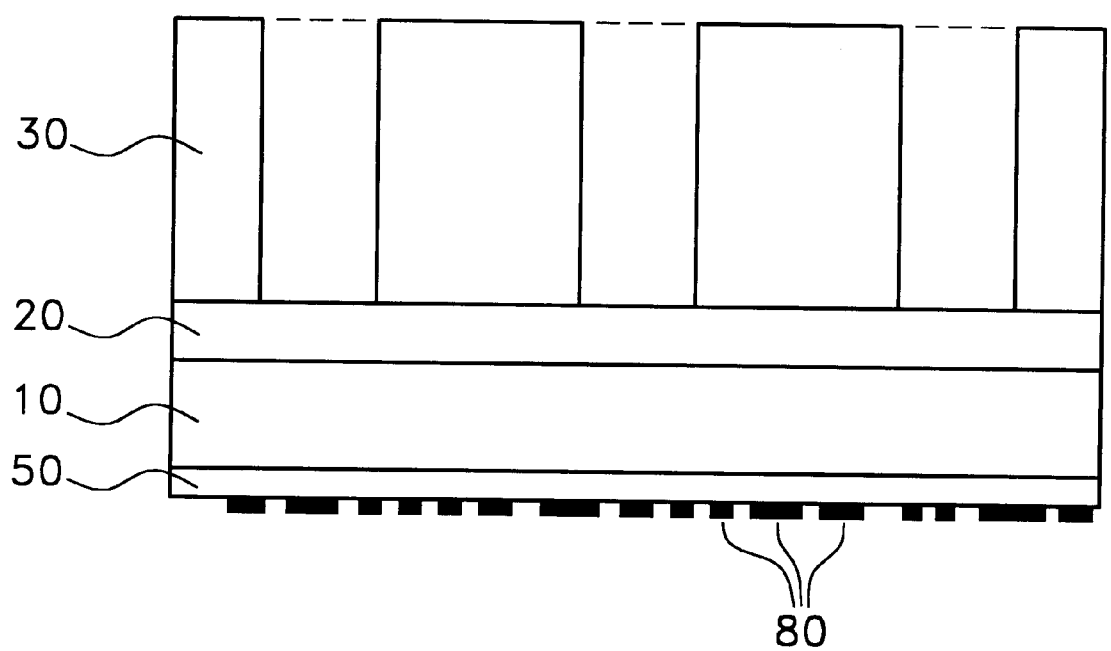
FIG. 5 illustrates a cross section of a silicon-on-sapphire structure according to the invention.

Referring now to FIGS. 4A and 4B, a silicon wafer 60 containing a series of sensor networks 70 is formed using any suitable process. The silicon wafer 60 includes p+ areas 80 which include sensor network 70 and a group of contact areas 90 extending from the sensor network 70. Outside of the contact areas 90, another p+ area 100 separate from the contact areas 90 but surrounding them, is also formed. The silicon wafer 60 is preferably fusion-bonded to the oxidized surface 17 of the first wafer 10, using the techniques described in the previously incorporated, commonly assigned U.S. Pat. No. 5,286,671, and the non p+ areas are removed using any suitable method, for example a conductivity selective etch, resulting in a structure such as that illustrated in FIG. 5. The remaining structure can be seen to include the p+ portions 80 of the silicon wafer 60 fusion bonded to the oxidized surface 50 of the first sapphire wafer 10, for example.

Next, appropriate areas 110 in the p+ contact regions 90 are preferably metalized using a high temperature metal system such as platinum silicide, titanium, or platinum.

Figure 6:
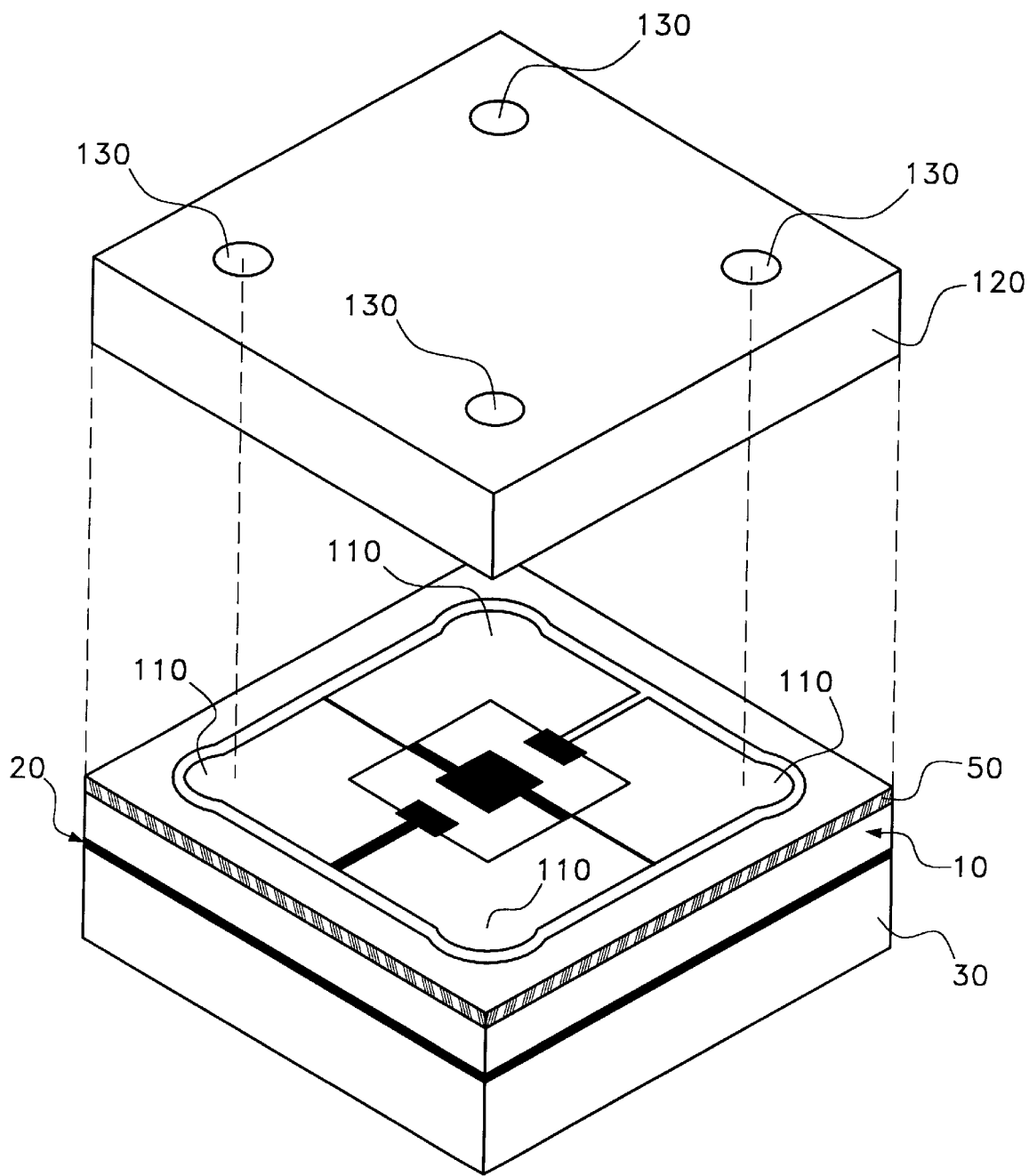
FIG. 6 illustrates a perspective view of a seal being applied to the structure of FIG. 5.

Referring now to FIG. 6, a fourth wafer 120 made of any suitable, non-conductive material, such as glass for example, is prepared such that there are a series of apertures 130 corresponding to the various metalized contact areas 110. Additionally, there is preferably provided a slight depression 150 in the glass wafer 120 corresponding to the area of the sensor network 70 to allow the diaphragm to deflect without touching the glass wafer 120.

Figure 7:
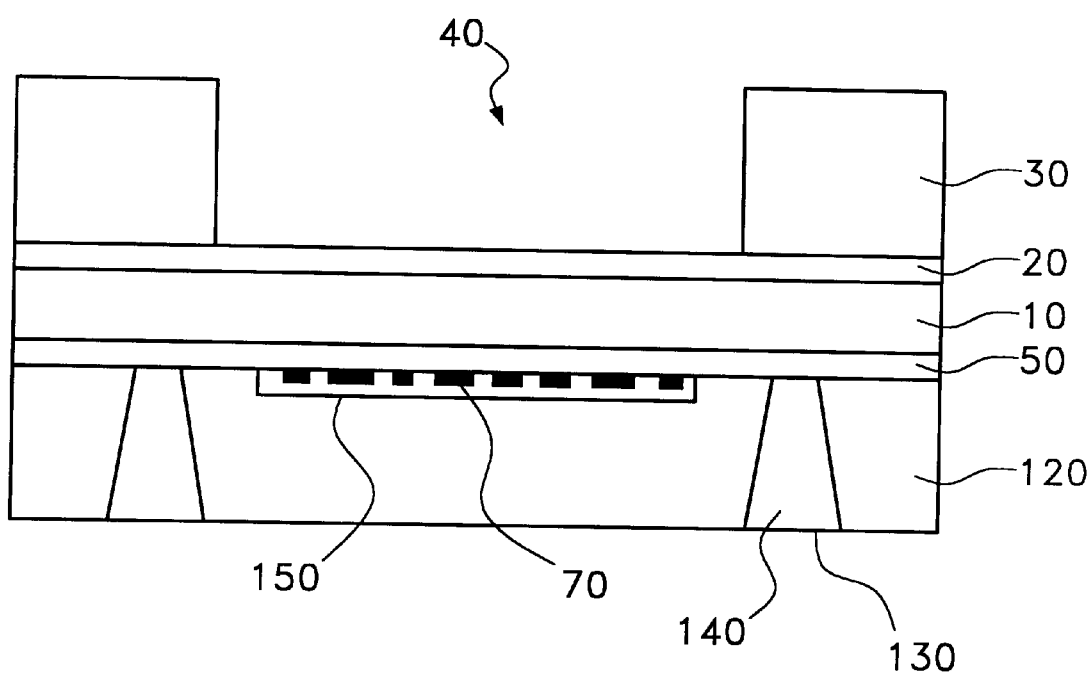
FIG. 7 illustrates an enlarged cross section of a structure formed according to method of the invention.

Referring now also to FIG. 7, the glass wafer 120 is preferably sealed using an ES Bond to the p+ contact areas 90, and the apertures 130 over the metalized areas 110 are filled with a glass metal frit 140 to make electrical contacts to metalized areas 110 of the p+ regions 80. If the seal of the glass wafer 120 to the p+ contact area 90 is not through a central aperture in the glass wafer 120 over the deflecting portion of the first wafer 10, an absolute sensor will result. If there is a through-central aperture, a gage or differential sensor will result.

There are a number of unanticipated advantages to the structure above. The method makes possible the construction of relatively small silicon-on-sapphire transducers with greater sensitivity and higher frequency response at a lower cost than conventional methods. The method makes possible the construction of either gauge or absolute transducers without the need for additional hermetic seals with headers, etc. as is understood by those possessing ordinary skill in the pertinent art. The method eliminates the need for ball-bond contacts to the silicon-on-sapphire surface resulting in greater reliability. The method makes possible much higher temperature operation by using a metal-glass frit as the contact means to the p+ region. The method does not require epitoxial growth of silicon-on-sapphire making it cheaper. And, the use of fusion bonding enables a much more degenerate sensing network to be formed.

Having described the preferred embodiment of this invention, it is evident that other embodiments incorporating these concepts may be used. Accordingly, although the invention has been described and pictured in a preferred form with a certain degree of particularity, it is understood that the present disclosure of the preferred form has been made only by way of example and that numerous changes in the detail of construction, in combination, and arrangement of parts, may be made without departing from the spirit and scope of the invention as here and after claimed. It is intended that the patent shall cover by suitable expression in the appended claims, whatever features of patentable novelty exist in the invention disclosed.

We claim:

1. A silicon-on-sapphire semiconductor structure comprising:
    a sapphire wafer of a predetermined thickness;
    a first silicon layer formed on a first surface of said sapphire wafer;
    p+ regions configured in a predetermined pattern indicative of a semiconductor structure bonded to said first surface of said sapphire wafer such that said silicon layer is interposed between said p+ regions and said sapphire wafer;
    a second silicon layer formed on a second surface of said sapphire wafer, said second surface opposite said first surface; and
    a sapphire layer having at least one aperture formed on said second silicon layer.

2. The structure of claim 1, wherein said first silicon layer is oxidized.

3. The structure as recited in claim 1 further comprising:
    a non-conductive material containing a series of apertures corresponding to contact areas in said p+ regions.

4. The structure as recited in claim 3 wherein said non-conductive material contains a depression to allow deflection of said semiconductor structure without contacting said non-conductive material.

* * * * *